(12) United States Patent
Nagai

(10) Patent No.: US 11,031,386 B2
(45) Date of Patent: Jun. 8, 2021

(54) SEMICONDUCTOR DEVICE

(71) Applicant: ROHM CO., LTD., Kyoto (JP)

(72) Inventor: Yoshiteru Nagai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 7 days.

(21) Appl. No.: 16/247,039

(22) Filed: Jan. 14, 2019

(65) Prior Publication Data

US 2019/0229106 A1 Jul. 25, 2019

(30) Foreign Application Priority Data

Jan. 19, 2018 (JP) .............................. JP2018-007396

(51) Int. Cl.

| | | |
|---|---|---|
| H01L 27/02 | (2006.01) | |
| H01L 29/872 | (2006.01) | |
| H01L 29/06 | (2006.01) | |
| H01L 29/36 | (2006.01) | |
| H01L 29/866 | (2006.01) | |
| H01L 29/47 | (2006.01) | |
| H01L 29/45 | (2006.01) | |
| H01L 29/417 | (2006.01) | |

(52) U.S. Cl.
CPC ...... *H01L 27/0248* (2013.01); *H01L 29/0619* (2013.01); *H01L 29/0684* (2013.01); *H01L 29/36* (2013.01); *H01L 29/866* (2013.01); *H01L 29/872* (2013.01); *H01L 29/0692* (2013.01); *H01L 29/417* (2013.01); *H01L 29/456* (2013.01); *H01L 29/47* (2013.01)

(58) Field of Classification Search
CPC ............ H01L 29/0619; H01L 27/0248; H01L 29/872; H01L 29/0684; H01L 29/36; H01L 29/866; H01L 29/456
See application file for complete search history.

(56) References Cited

U.S. PATENT DOCUMENTS 5,089,427 A * 2/1992 Schoenberg ...... H01L 29/66106
148/DIG. 174
8,164,154 B1 * 4/2012 Tanielian .............. H01L 29/872
257/452

(Continued)

FOREIGN PATENT DOCUMENTS

| JP | 2009164238 A | 7/2009 |
|---|---|---|
| JP | 2016066813 A | 4/2016 |

*Primary Examiner* — Eugene Lee
(74) *Attorney, Agent, or Firm* — Hamre, Schumann, Mueller & Larson, P.C.

(57) ABSTRACT

A semiconductor device includes a first conductivity type semiconductor layer, a second conductivity type region selectively formed in the semiconductor layer, a second conductivity type peripheral impurity region formed around the second conductivity type region in the semiconductor layer, and a Schottky electrode that is formed on the semiconductor layer and that forms a Schottky junction portion between a first conductivity type part of the semiconductor layer and the Schottky electrode, and, in the semiconductor device, a pn junction portion between the peripheral impurity region and the first conductivity type part of the semiconductor layer has a higher withstand voltage than a Zener voltage $V_Z$ of a Zener diode made of a pn junction portion between the second conductivity type region and the first conductivity type part of the semiconductor layer.

13 Claims, 11 Drawing Sheets

(56) References Cited

U.S. PATENT DOCUMENTS

| | | | |
|---|---|---|---|
| 8,680,587 B2* | 3/2014 | Henning | H01L 29/8611 |
| | | | 257/267 |
| 9,231,122 B2* | 1/2016 | Henning | H01L 29/8611 |
| 2002/0125482 A1* | 9/2002 | Friedrichs | H01L 21/0485 |
| | | | 257/73 |
| 2004/0212011 A1* | 10/2004 | Ryu | H01L 29/66068 |
| | | | 257/335 |
| 2008/0277668 A1* | 11/2008 | Okuno | H01L 29/0692 |
| | | | 257/77 |
| 2009/0160008 A1* | 6/2009 | Fujiwara | H01L 29/861 |
| | | | 257/471 |
| 2009/0212301 A1* | 8/2009 | Zhang | H01L 29/0619 |
| | | | 257/77 |
| 2011/0207321 A1* | 8/2011 | Fujiwara | H01L 21/324 |
| | | | 438/663 |
| 2011/0215338 A1* | 9/2011 | Zhang | H01L 29/6606 |
| | | | 257/73 |
| 2014/0284754 A1* | 9/2014 | Yamamoto | H01L 23/49551 |
| | | | 257/487 |
| 2015/0034970 A1 | 2/2015 | Aketa et al. | |
| 2015/0243612 A1* | 8/2015 | Yamamoto | H01L 21/78 |
| | | | 257/693 |
| 2015/0311278 A1 | 10/2015 | Aketa et al. | |

* cited by examiner

SEMICONDUCTOR DEVICE

CROSS-REFERENCE TO RELATED APPLICATIONS

The present application corresponds to Japanese Patent Application No. 2018-007396 filed with the Japan Patent Office on Jan. 19, 2018, and the entire disclosure of the application is incorporated herein by reference.

TECHNICAL FIELD

The present invention relates to a semiconductor device that has a Schottky junction portion and a Zener diode structure.

BACKGROUND ART

For example, Patent Document 1 (Japanese Patent Application Publication No. 2009-164238) discloses a Schottky barrier diode, and the Schottky barrier diode is composed of a semiconductor substrate that has a first conductivity type semiconductor layer on a front surface, a guard ring that consists of a second conductivity type semiconductor layer disposed at a predetermined depth from the front surface of the first conductivity type semiconductor layer and a second conductivity type semiconductor layer formed in an annular shape so as to surround the second conductivity type semiconductor layer, an insulating layer that is formed at a front surface of the first conductivity type semiconductor layer and that has an opening, and a metallic layer disposed so as to come into contact with the first conductivity type semiconductor layer and with the second conductivity type semiconductor layer within the opening, and the Schottky barrier diode is arranged so that the metallic layer extends onto the insulating layer.

SUMMARY OF INVENTION

By the way, a TVS (Transient Voltage Suppressor) diode has been known as a device for communication line protection. The TVS diode is incorporated into, for example, a communication line as a bidirectional Zener diode that is capable of absorbing a plus or minus surge, and, when a high voltage is momentarily applied to the communication line due to ESD (Electro Static Discharge), an output voltage to a terminal circuit is clamped to become a predetermined voltage value or less.

However, a general Zener structure (pn junction portion) has a comparatively long reverse recovery time trr, and therefore a delay is liable to occur at a polarity inversion timing of an input voltage (input signal). The problem of this delay becomes more obvious in proportion to an increase in speed of a processing signal.

In this respect, if a Schottky barrier diode, such as that of Patent Document 1, is used as a TVS diode, it will be possible to quicken the reverse recovery time trr, and yet, in opposition to this, there is a case in which the ESD permissible amount of the diode is lowered.

An object of the present invention is to provide a semiconductor device that is capable of restraining a reduction in the ESD permissible amount while shortening a reverse recovery time trr and that is capable of realizing desirable Zener characteristics.

A semiconductor device according to a preferred embodiment of the present invention includes a first conductivity type semiconductor layer, a second conductivity type region selectively formed in the semiconductor layer, a second conductivity type peripheral impurity region formed around the second conductivity type region in the semiconductor layer, and a Schottky electrode that is formed on the semiconductor layer and that forms a Schottky junction portion between a first conductivity type part of the semiconductor layer and the Schottky electrode, and, in the semiconductor device, a pn junction portion between the peripheral impurity region and the first conductivity type part of the semiconductor layer has a higher withstand voltage than a Zener voltage $V_Z$ of a Zener diode made of a pn junction portion between the second conductivity type region and the first conductivity type part of the semiconductor layer.

According to this configuration, it is possible to allow a forward current to flow through the Schottky junction portion, and therefore it is possible to make a reverse recovery time trr taken when a reverse voltage is applied to the Schottky junction portion shorter than in a case in which a forward current is allowed to flow through a pn junction portion. On the other hand, the second conductivity type region having a relatively low withstand voltage and the peripheral impurity region having a relatively higher withstand voltage than the second conductivity type region, each of which serves as a pn junction region, are formed mutually independently. Hence, when a reverse voltage is applied, it is possible to hold a high ESD permissible amount by the peripheral impurity region and an output voltage can be clamped to become a predetermined voltage value or less by the Zener diode. In other words, in the semiconductor layer having the Schottky junction portion, it is possible to realize a semiconductor device that satisfies the requirement of three characteristics of the reverse recovery time trr, the Zener voltage $V_z$, and the ESD permissible amount by providing two kinds of regions, i.e., by providing the pn junction portion (the second conductivity type region) that undertakes the Zener voltage $V_z$ and the pn junction portion (the peripheral impurity region) that undertakes the ESD permissible amount.

In the semiconductor device according to a preferred embodiment of the present invention, based on a front surface of the semiconductor layer, the peripheral impurity region may be deeper than the second conductivity type region.

In the semiconductor device according to a preferred embodiment of the present invention, a depth of the peripheral impurity region may be 1.2 µm to 4.2 µm, and a depth of the second conductivity type region may be 0.6 µm to 1.4 µm.

In the semiconductor device according to a preferred embodiment of the present invention, a series resistance of the first conductivity type part of the semiconductor layer may be 0.09 ω·cm to 0.14 ω·cm.

In the semiconductor device according to a preferred embodiment of the present invention, a depth of the peripheral impurity region may be 3.6 µm to 4.5 µm, and a depth of the second conductivity type region may be 0.9 µm to 2.5 µm.

In the semiconductor device according to a preferred embodiment of the present invention, a series resistance of the first conductivity type part of the semiconductor layer may be 0.14 Ω·cm to 0.2 Ω·cm.

In the semiconductor device according to a preferred embodiment of the present invention, in a depth direction from a front surface of the semiconductor layer, a concentration gradient of the peripheral impurity region may be more gradual than a concentration gradient of the second conductivity type region.

In the semiconductor device according to a preferred embodiment of the present invention, the peripheral impurity region may have an impurity concentration of $1\times10^{18}$ cm$^{-3}$ to $5\times10^{19}$ cm$^{-3}$, and the second conductivity type region may have an impurity concentration of $5\times10^{18}$ cm$^{-3}$ to $1\times10^{20}$ cm$^{-3}$.

In the semiconductor device according to a preferred embodiment of the present invention, the second conductivity type regions may be arranged in a dot shape manner in a plan view, and the peripheral impurity region may include a guard ring that surrounds the second conductivity type regions.

In the semiconductor device according to a preferred embodiment of the present invention, the second conductivity type regions may be arranged in a stripe shape manner in a plan view, and the peripheral impurity region may include a guard ring that surrounds the second conductivity type regions.

In the semiconductor device according to a preferred embodiment of the present invention, the semiconductor layer may have a planar size of 0.2 mm square to 0.45 mm square.

The semiconductor device according to a preferred embodiment of the present invention may include a bidirectional Zener diode incorporated in a communication circuit.

DESCRIPTION OF EMBODIMENTS

Preferred embodiments of the present invention will be hereinafter described in detail with reference to the accompanying drawings.

Figure 1:
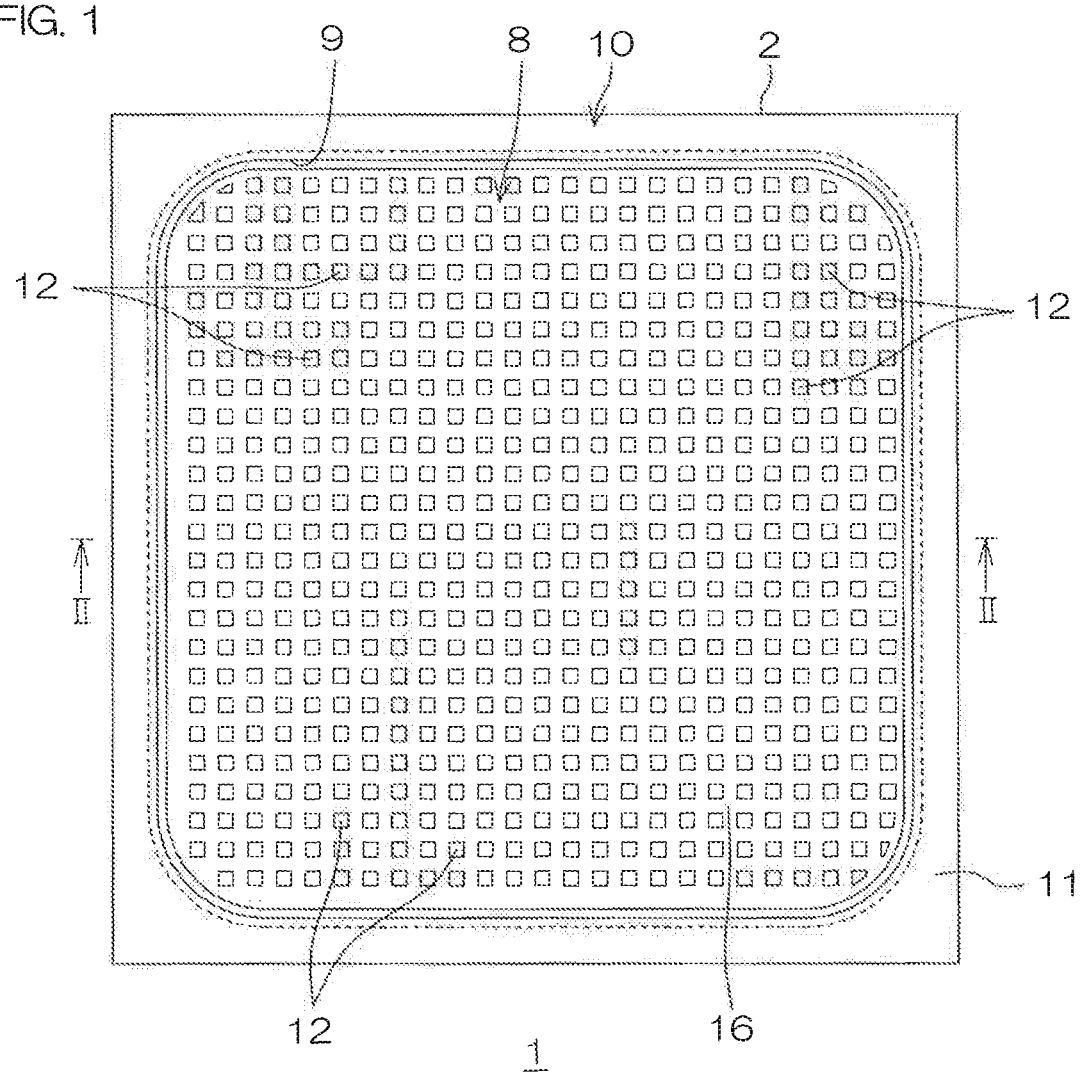
FIG. 1 is a schematic plan view of a semiconductor device according to a preferred embodiment of the present invention.
Figure 2:
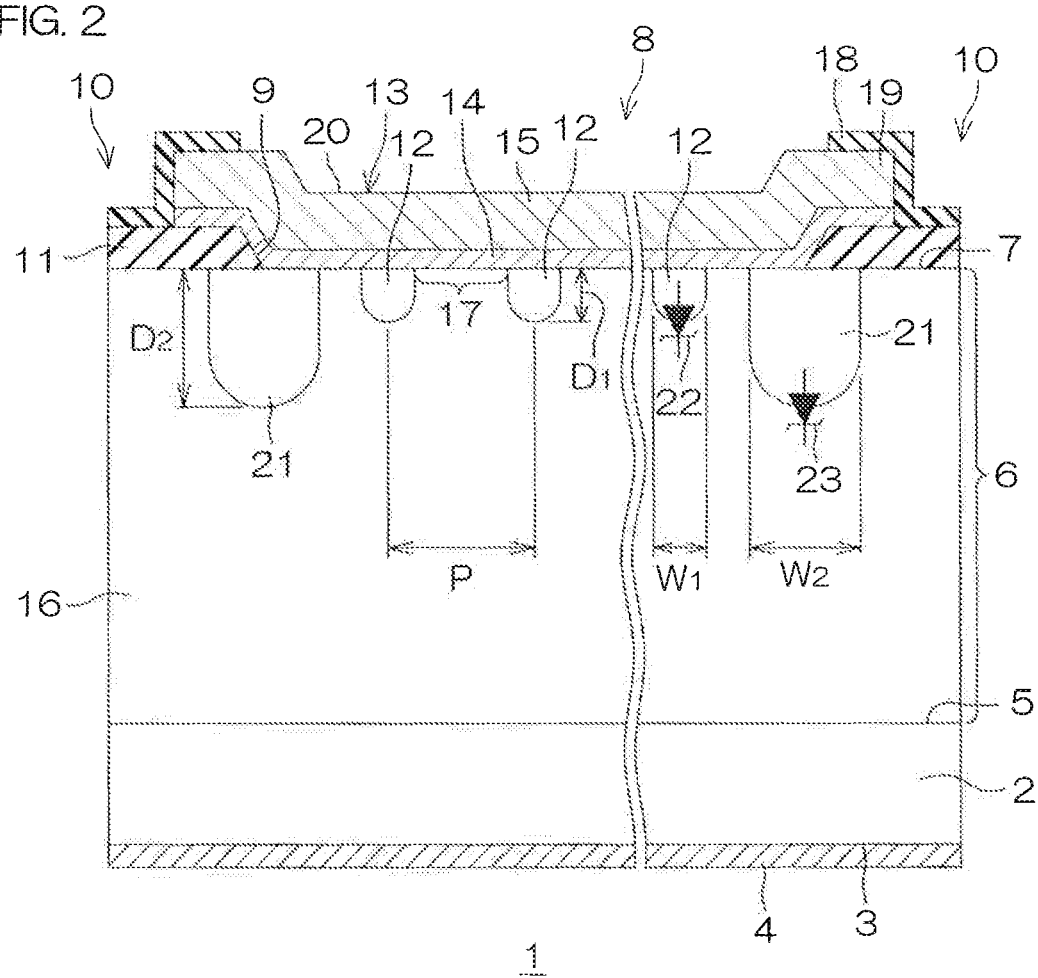
FIG. 2 is a cross-sectional view taken along section line II-II of FIG. 1.
Figure 3A:
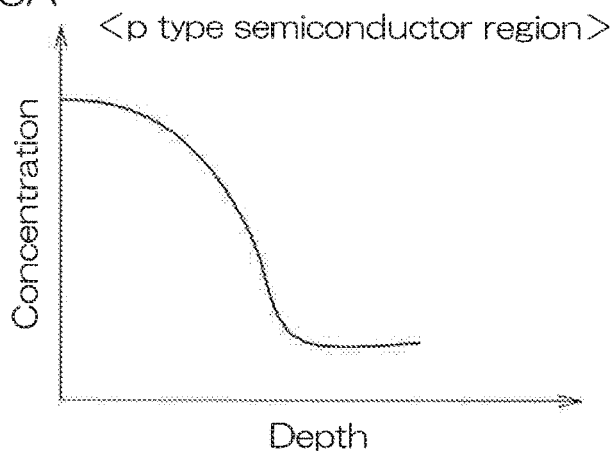
FIG. 3A is a view showing a concentration gradient of a p type semiconductor region.
Figure 3B:
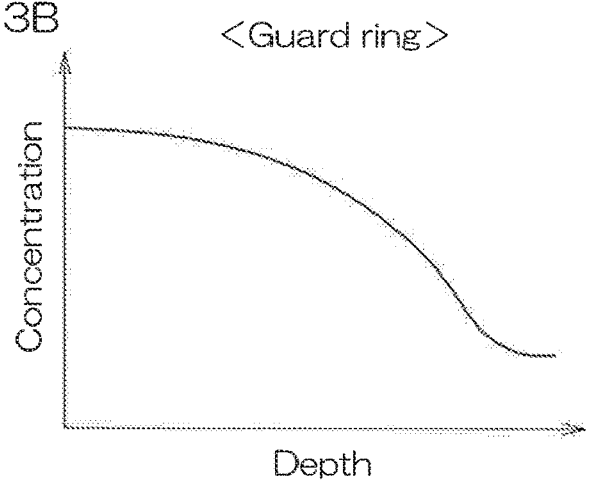
FIG. 3B is a view showing a concentration gradient of a guard ring.

FIG. 1 is a schematic plan view of a semiconductor device 1 according to a preferred embodiment of the present invention. FIG. 2 is a cross-sectional view taken along section line II-II of FIG. 1. FIG. 3A is a view showing a concentration gradient of a p type semiconductor region 12. FIG. 3B is a view showing a concentration gradient of a guard ring 21. In FIG. 1, an anode electrode 13 and a surface insulating film 18 are not shown.

The semiconductor device 1 has, for example, a square chip shape in a plan view, and its lengths in up-down and right-left directions in the sheet of FIG. 1 may be each 0.2 mm to 0.45 mm.

The semiconductor device 1 includes a substrate 2 (Si substrate) made of n$^+$ type Si that is an example of a semiconductor layer of the present invention. The thickness of the substrate 2 may be, for example, 50 µm to 300 µm. For example, N (nitrogen), P (phosphorus), As (arsenic), or Sb (antimony) can be used as an n type impurity contained in the substrate 2.

A cathode electrode 4 serving as an ohmic electrode is formed on a rear surface 3 of the substrate 2 so as to cover its whole area. The cathode electrode 4 is made of a metal (e.g., Au or Ag) that makes ohmic contact with n type Si. The thickness of the cathode electrode 4 may be, for example, 0.3 µm to 2.0 µm.

An epitaxial layer 6 made of n type Si that is an example of a semiconductor layer of the present invention is formed on a front surface 5 of the substrate 2.

A field insulating film 11 that has a contact hole 9 exposing a part of the epitaxial layer 6 as an active region 8 and with which an outer peripheral region 10 surrounding the active region 8 is covered is formed on a front surface 7 of the epitaxial layer 6. The field insulating film 11 is made of, for example, SiO$_2$ (silicon oxide). The thickness of the field insulating film 11 is, for example, 0.5 µm to 3 µm.

The p type semiconductor region 12 is selectively formed in the active region 8 on the front-surface-7 side of the epitaxial layer 6. Hence, a Zener diode 22 made of a pn junction between the p type semiconductor region 12 and an n type part 16 is formed in the epitaxial layer 6. The p type semiconductor region 12 has a bottom portion that is formed in the shape of a substantially curved surface in a cross-sectional view and that is formed with a substantially constant width in a depth direction from the front surface 7 of the epitaxial layer 6. In the present preferred embodiment, the p type semiconductor region 12 is made up of a plurality of dots arranged in a matrix manner in a plan view as shown in FIG. 1. Hence, the n type part 16 having a latticed shape in a plan view is exposed to the front surface 7 of the epitaxial layer 6. For example, B (boron), Al (aluminum), or Ar (argon) can be used as a p type impurity contained in the p type semiconductor region 12.

The anode electrode 13 is formed on the field insulating film 11. The anode electrode 13 may have a two-layer structure consisting of a Schottky metal 14 and a contact metal 15.

The Schottky metal 14 is joined to the n type part 16 of the epitaxial layer 6 in the contact hole 9 of the field insulating film 11, and forms a Schottky junction portion 17 between the n type part 16 and the Schottky metal 14. The Schottky metal 14 is buried into the contact hole 9 of the field insulating film 11, and projects in a flange-shaped manner outwardly from the contact hole 9 so as to cover a peripheral edge portion of the contact hole 9 in the field insulating film 11 from above.

Preferably, Pt (platinum) is used as the Schottky metal 14 in the present preferred embodiment although specific limitations are not imposed if a metal capable of forming the Schottky junction portion 17 between the n type part 16 and the Schottky metal 14 is used. Pt is capable of forming a comparatively high Schottky barrier between an n type semiconductor or the like and the Schottky metal 14. Therefore, for example, even when the n type impurity concentration of the epitaxial layer 6 is heightened to lessen resistance in order to form the Zener diode 22 between the p type semiconductor region 12 and the n type part 16, it is possible to restrain the occurrence of a leakage current more reliably than in a case in which Ti or the like is used. Of course, Ti can be used depending on the concentration of the epitaxial layer 6.

The contact metal 15 is stacked on the Schottky metal 14, and projects in a flange-shaped manner outwardly from the contact hole 9 so as to cover the peripheral edge portion of the contact hole 9 in the field insulating film 11 from above in the same way as the Schottky metal 14. The contact metal 15 may be made of, for example, Al (aluminum).

The surface insulating film 18 is formed on a topmost surface of the semiconductor device 1. The surface insulating film 18 is made of, for example, SiN (silicon nitride). The thickness of the surface insulating film 18 is, for example, 0.2 μm to 2.0 μm. The surface insulating film 18 covers a flange portion 19 riding on the field insulating film 11 in the contact metal 15, and, on the other hand, exposes a central part 20 of the contact metal 15, which is surrounded by the flange portion 19 and which is hollower than the flange portion 19, as a pad. For example, a joining member, such as a bonding wire, is joined to the exposed central part 20.

The guard ring 21 that is an example of a peripheral impurity region of the present invention is formed on the front-surface-7 side of the epitaxial layer 6 in the outer peripheral region 10. Hence, a pn junction portion 23, which is created by pn junction between the p type guard ring 21 and the n type part 16, is formed at the epitaxial layer 6. The guard ring 21 has a bottom portion that is formed in the shape of a substantially curved surface in a cross-sectional view and that is formed with a substantially constant width up to a deeper position than the p type semiconductor region 12 in the depth direction from the front surface 7 of the epitaxial layer 6. In the present preferred embodiment, the guard ring 21 is formed so as to surround the p type semiconductor region 12 along an outline of the contact hole 9 in such a manner as to straddle between the inside and outside of the contact hole 9 of the field insulating film 11 in a plan view (i.e., as to straddle between the active region 8 and the outer peripheral region 10) as shown in FIG. 1. Therefore, the guard ring 21 includes an inner part that projects inwardly from the contact hole 9 and an outer part that projects outwardly from the contact hole 9. The inner part of the guard ring 21 is in contact with a terminal portion of the anode electrode 13 (the Schottky metal 14) in the contact hole 9. The outer part of the guard ring 21 faces the anode electrode 13 with the peripheral edge portion of the field insulating film 11 therebetween.

In the semiconductor device 1 according to the present preferred embodiment, parameters of physical quantities and parameters of physical properties of respective components of the semiconductor device 1 are appropriately set so as to excellently achieve a Zener breakdown with the Zener diode 22 between the p type semiconductor region 12 and the n type part 16 and so as to produce an excellent ESD permissible amount by the guard ring 21.

For example, suppose a case in which the Zener voltage $V_z$ of the Zener diode 22 is designed to be 16 V to 18 V and in which the withstand voltage (breakdown voltage) of the pn junction portion 23 is designed to be 24 V to 30 V.

In this case, with respect to the depth of the guard ring 21 and the depth of the p type semiconductor region 12, the guard ring 21 may have a depth $D_2$ of, for example, 1.2 μm to 4.2 μm, and the p type semiconductor region 12 may have a depth $D_1$ of, for example, 0.6 μm to 1.4 μm.

On the other hand, with respect to the impurity concentration of the guard ring 21 and the impurity concentration of the p type semiconductor region 12, the concentration gradient of the guard ring 21 may be more gradual than the concentration gradient of the p type semiconductor region 12 in the depth direction from the front surface 7 of the epitaxial layer 6 as shown in FIG. 3A and FIG. 3B. In more detail about the impurity concentration, the guard ring 21 may have an impurity concentration of, for example, $1 \times 10^{18}$ $cm^{-3}$ to $5 \times 10^{19}$ $cm^{-3}$, and the p type semiconductor region 12 may have an impurity concentration of, for example, $5 \times 10^{18}$ $cm^{-3}$ to $1 \times 10^{20}$ $cm^{-3}$.

The series resistance of the n type part 16 of the epitaxial layer 6 may be, for example, 0.09 Ω·cm to 0.14 Ω·cm. It is possible to adjust the series resistance of the n type part 16, for example, by setting the thickness of the epitaxial layer 6 and the plane area of the Schottky junction portion 17 so as to fall within appropriate ranges, respectively. The Schottky junction portion 17 is a region other than the p type semiconductor region 12 and the guard ring 21 in the epitaxial layer 6 as shown in FIG. 1, and therefore it is possible to adjust the plane area of the Schottky junction portion 17, for example, by changing the pitch P of the p type semiconductor region 12 (i.e., distance of a central space between mutually adjoining p type semiconductor regions 12), the width $W_1$ of the p type semiconductor region 12, and the width $W_2$ of the guard ring 21 that are shown in FIG. 2. In more detail about the physical quantity, for example, the thickness of the epitaxial layer 6 may be not less than the depth $D_2$ of the guard ring 21 and not more than 7 μm, the pitch P of the p type semiconductor region 12 may be 4.0 μm to 12.0 μm, the width $W_1$ of the p type semiconductor region 12 may be 1.0 μm to 7.0 μm, and the width $W_2$ of the guard ring 21 may be 10 μm to 40 μm.

Next, suppose a case in which the Zener voltage $V_z$ of the Zener diode 22 is designed to be 24 V to 27 V and in which the withstand voltage (breakdown voltage) of the pn junction portion 23 is designed to be 35 V to 40 V.

In this case, with respect to the depth of the guard ring 21 and the depth of the p type semiconductor region 12, the guard ring 21 may have a depth $D_2$ of, for example, 3.6 μm to 4.5 μm, and the p type semiconductor region 12 may have a depth $D_1$ of, for example, 0.9 μm to 2.5 μm.

On the other hand, with respect to the impurity concentration of the guard ring 21 and the impurity concentration of the p type semiconductor region 12, the concentration gradient of the guard ring 21 may be more gradual than the concentration gradient of the p type semiconductor region 12 in the depth direction from the front surface 7 of the epitaxial layer 6 as shown in FIG. 3A and FIG. 3B. In more detail about the impurity concentration, the guard ring 21 may have an impurity concentration of, for example, $1 \times 10^{18}$ $cm^{-3}$ to $5 \times 10^{19}$ $cm^{-3}$, and the p type semiconductor region 12 may have an impurity concentration of, for example, $5 \times 10^{18}$ $cm^{-3}$ to $1 \times 10^{20}$ $cm^{-3}$.

The series resistance of the n type part 16 of the epitaxial layer 6 may be, for example, 0.14 Ω·cm to 0.2 Ω·cm. In more detail about the physical quantity, for example, the thickness of the epitaxial layer 6 may be not less than the depth $D_2$ of the guard ring 21 and not more than 7 μm, the pitch P of the p type semiconductor region 12 may be 4.0 μm to 12.0 μm, the width $W_1$ of the p type semiconductor region 12 may be 1.0 μm to 7.0 μm, and the width $W_2$ of the guard ring 21 may be 10 μm to 40 μm.

It should be noted that the pitch P of the p type semiconductor region 12 (including a case in which a plurality of p type semiconductor regions 12 are arranged in a stripe shape manner as described later) is set to fall within the aforementioned range in order to adjust the area ratio of both the pn junction portion 23 and the Schottky junction portion 17 in the active region 8. For example, it is preferable to set the area ratio of the Schottky junction portion 17 in the active region 8 at 20% to 50%, and the range of the pitch P of the p type semiconductor region 12 suitable to set this area ratio is fixed as mentioned above. It is possible to effectively reduce a reverse recovery time trr, and is possible to effectively improve the ESD permissible amount by setting the area ratio of the Schottky junction portion 17 at the aforementioned range.

Figure 4:
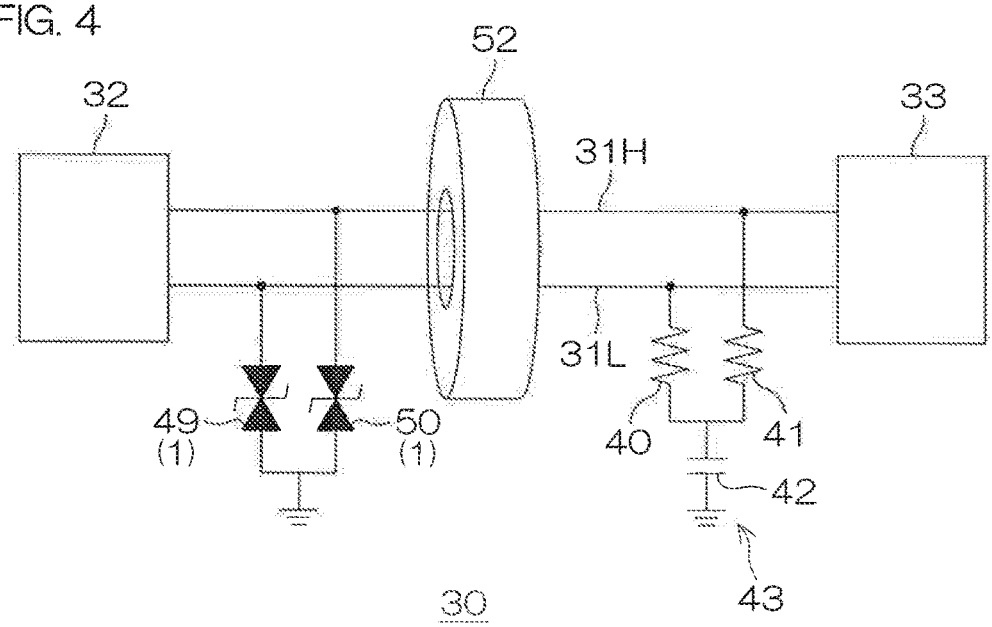
FIG. 4 is a view showing an example of a communication system in which the semiconductor device is incorporated.

FIG. 4 is a view showing an example of a communication system in which the semiconductor device 1 is incorporated.

The communication system 30 is a system in which, for example, CAN (Controller Area Network) data communication for vehicles is employed.

The communication system 30 has a high side line 31H and a low side line 31L, and includes electronic control units (ECU) 32 and 33 that are mutually communicably connected together through the lines 31H and 31L.

A terminal circuit 43 that includes, for example, resistors 40, 41 and a capacitor 42 is connected to the high side line 31H and to the low side line 31L.

Additionally, the above semiconductor devices 1, which serve as protective devices and which are used as a bidirectional Zener diode 49 and as a bidirectional Zener diode 50, are connected to the high side line 31H and to the low side line 31L, respectively.

In the thus formed communication system 30, the ECUs 32 and 33 are connected together through the communication lines, and communication data is transmitted and received through the communication lines. Based on received data, a control operation assigned to each ECU 32, 33 is performed.

On the other hand, there is a case in which a high voltage is momentarily applied to the communication system 30 due to electro static discharge (ESD) or the like while the communication system 30 is working. Even in this case, the bidirectional Zener diodes 49 and 50 make it possible to reduce an influence (for example, device fracture) upon the terminal circuit 43 if an output voltage to the terminal circuit 43 is appropriately clamped to become a predetermined voltage value or less.

However, a communication speed has been increased in recent years, and therefore it is necessary to reliably perform voltage clamping while preventing a delay in its output voltage. Therefore, the semiconductor device 1 used as the bidirectional Zener diodes 49 and 50 for protection includes the Schottky junction portion 17, and still additionally includes the Zener diode 22 and the pn junction portion 23 having a higher withstand voltage than the Zener voltage $V_z$ of the Zener diode 22 at the position of the guard ring 21.

Effects achieved by this configuration can be demonstrated by, for example, a BCI (Bulk Current Injection) test.

Figure 5:
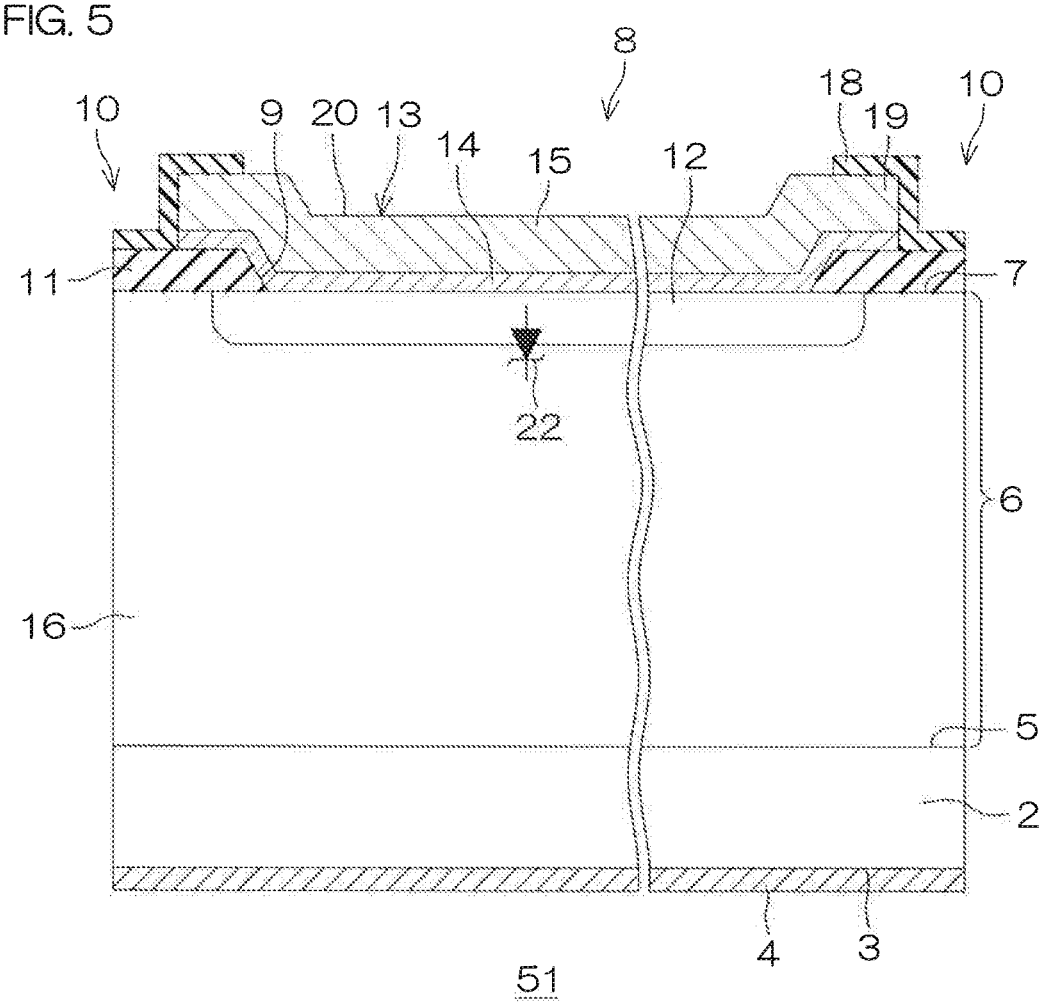
FIG. 5 is a schematic cross-sectional view of a semiconductor device according to a first reference example.
Figure 6:
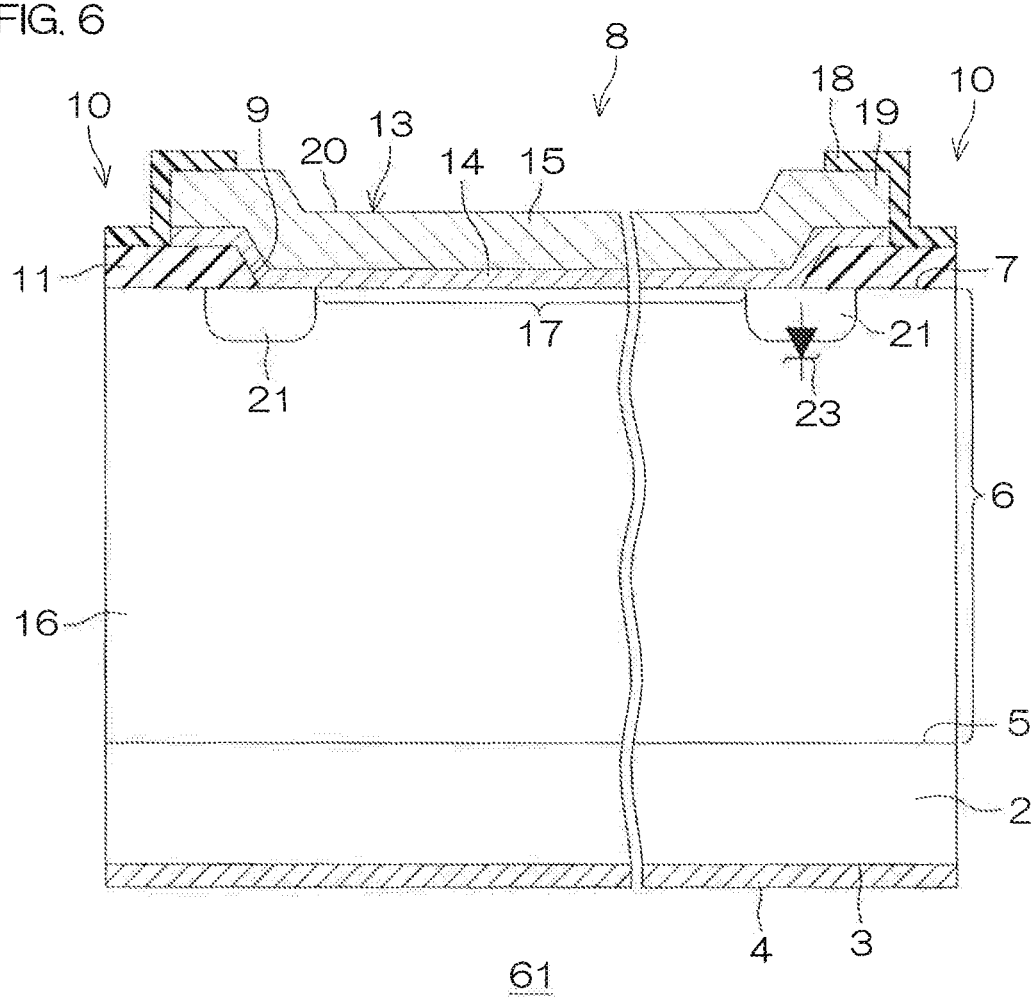
FIG. 6 is a schematic cross-sectional view of a semiconductor device according to a second reference example.
Figure 7:
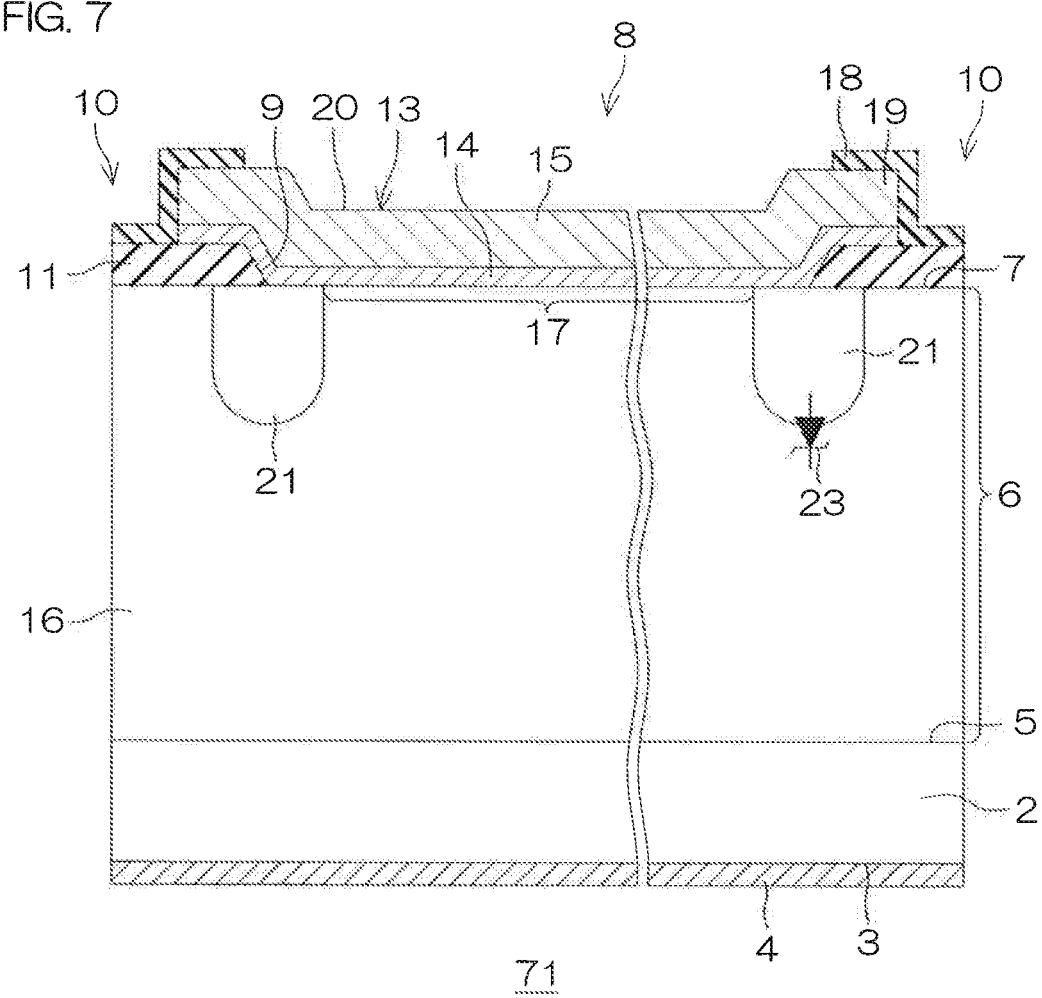
FIG. 7 is a schematic cross-sectional view of a semiconductor device according to a third reference example.

When effects demonstrated by the BCI test are described, semiconductor devices 51, 61, and 71 according to FIG. 5 (first reference example), FIG. 6 (second reference example), and FIG. 7 (third reference example) are each mentioned as a configuration compared with that of the semiconductor device 1.

The semiconductor device 51 of FIG. 5 has the p type semiconductor region 12 formed over the entirety on the front-surface-7 side of the active region 8 of the epitaxial layer 6, and differs from the semiconductor device 1 in the fact that the Schottky junction portion 17 and the guard ring 21 are not formed.

The semiconductor device 61 of FIG. 6 differs from the semiconductor device 1 in the fact that the p type semiconductor region 12 is not formed and that the depth of the guard ring 21 is substantially equal to that of the p type semiconductor region 12 although the Schottky junction portion 17 and the guard ring 21 are formed.

The semiconductor device 71 of FIG. 7 differs from the semiconductor device 1 in the fact that the p type semiconductor region 12 is not formed although the Schottky junction portion 17 and the guard ring 21 (which is deeper than the p type semiconductor region 12) are formed.

In the BCI test, an injection probe 52 is placed at a halfway portion of both the high side line 31H and the low side line 31L as shown in, for example, FIG. 4, and a noise current is injected from the injection probe 52.

Figure 8:
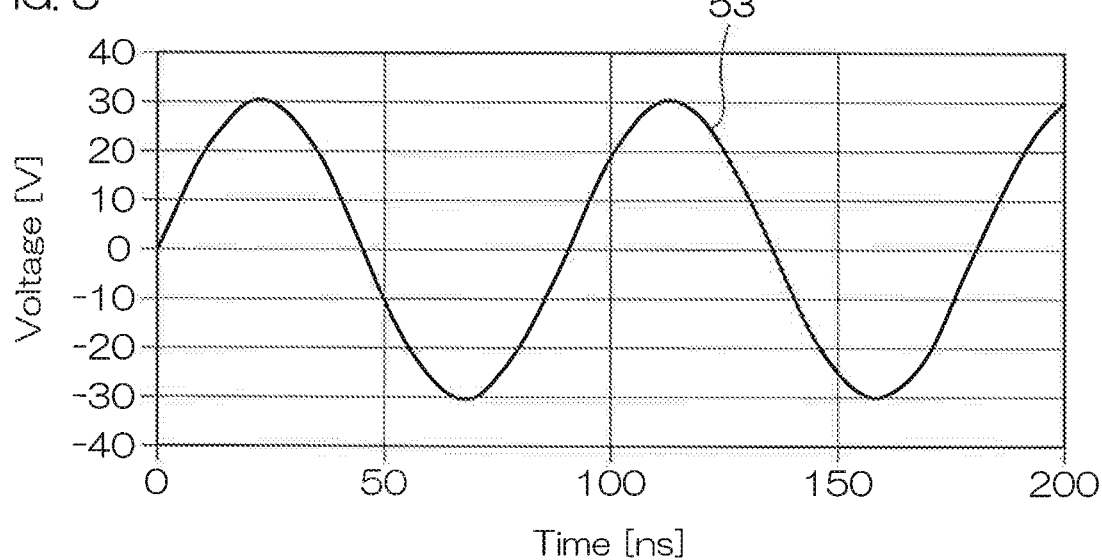
FIG. 8 is a view showing a waveform of an input voltage in a BCI test.
Figure 9A:
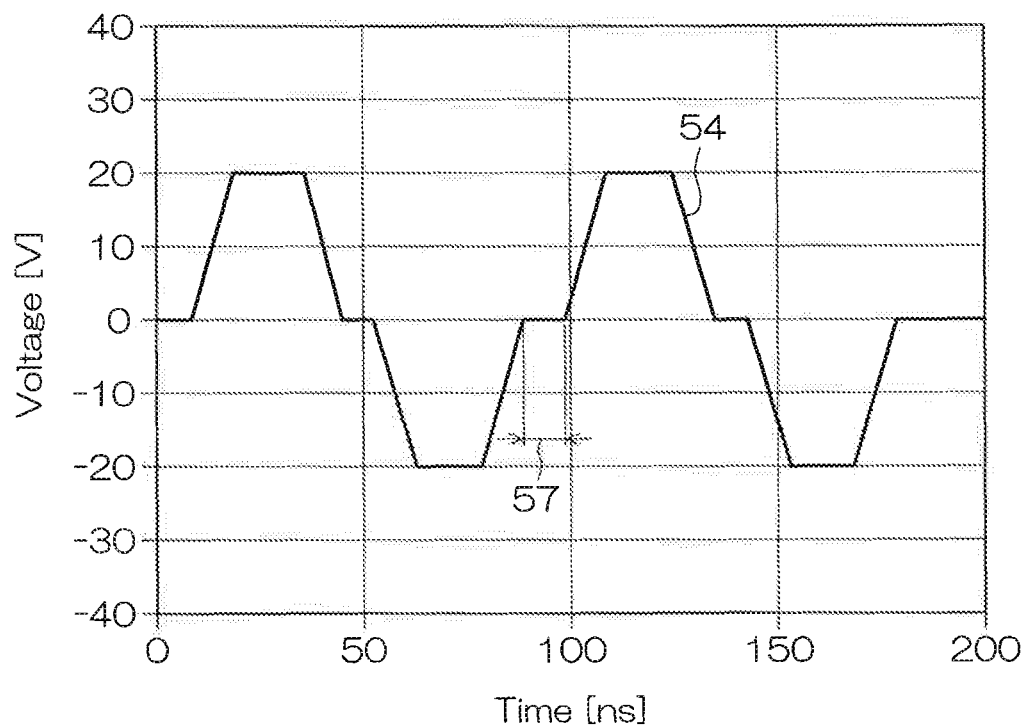
FIG. 9A and FIG. 9B are views each of which shows a waveform of an output voltage of a communication line when the semiconductor device according to the first reference example is incorporated.
Figure 9B:
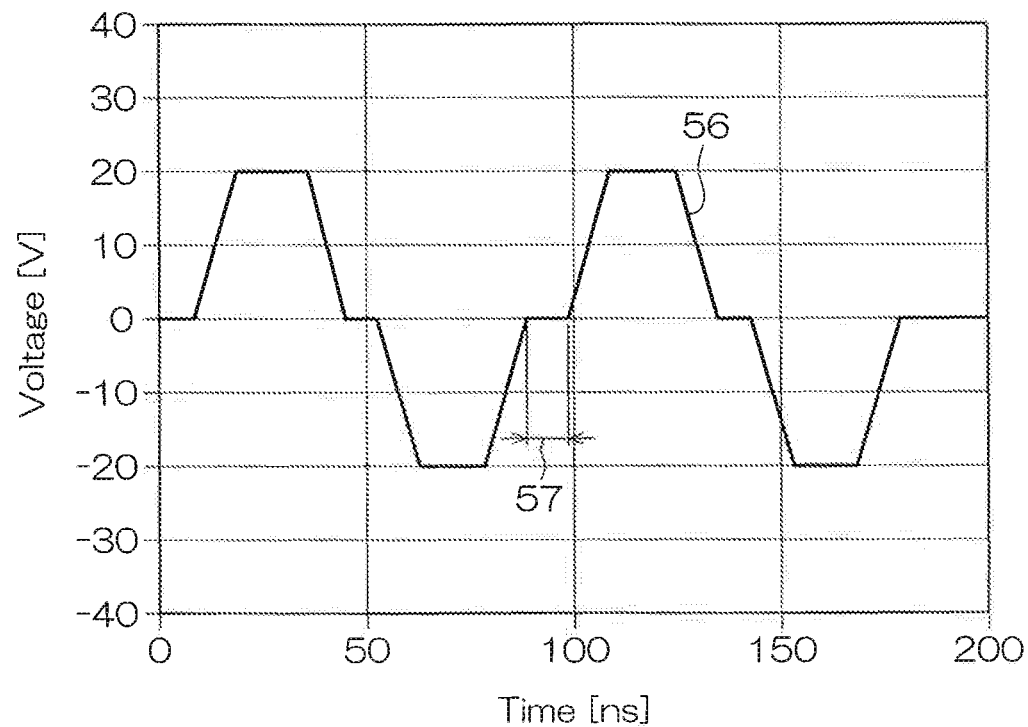
Figure 10A:
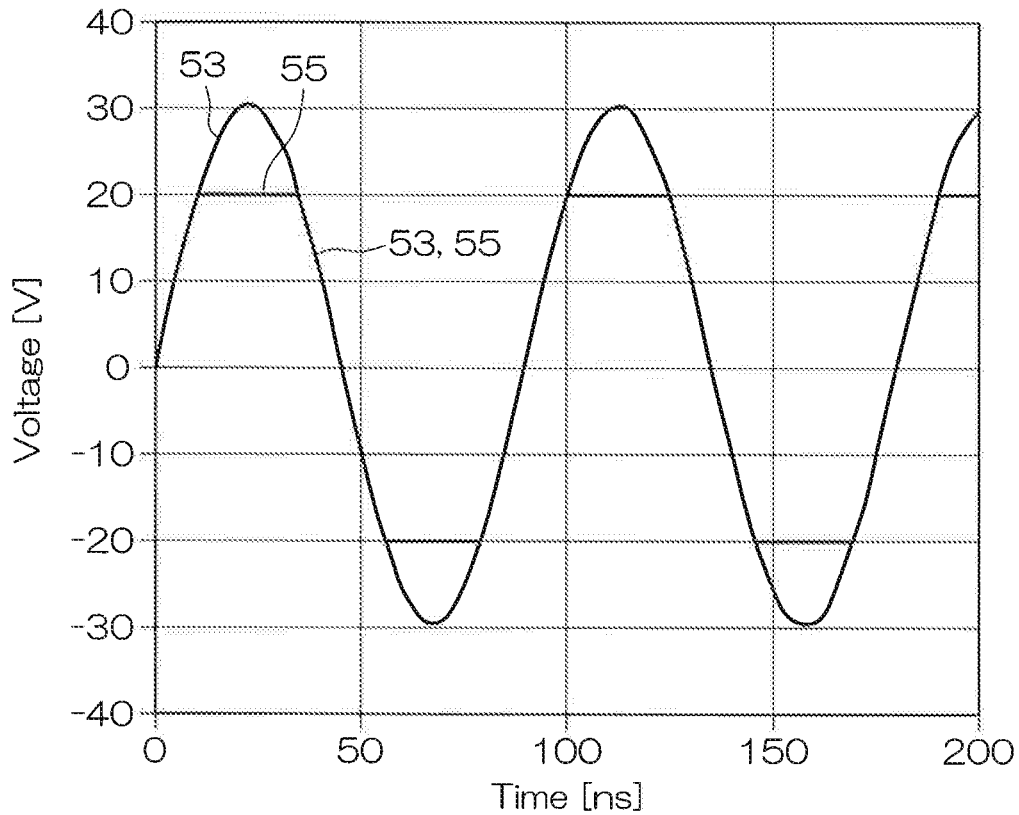
FIG. 10A and FIG. 10B are views each of which shows a waveform of an output voltage of the communication line when the semiconductor device according to the present invention is incorporated.
Figure 10B:
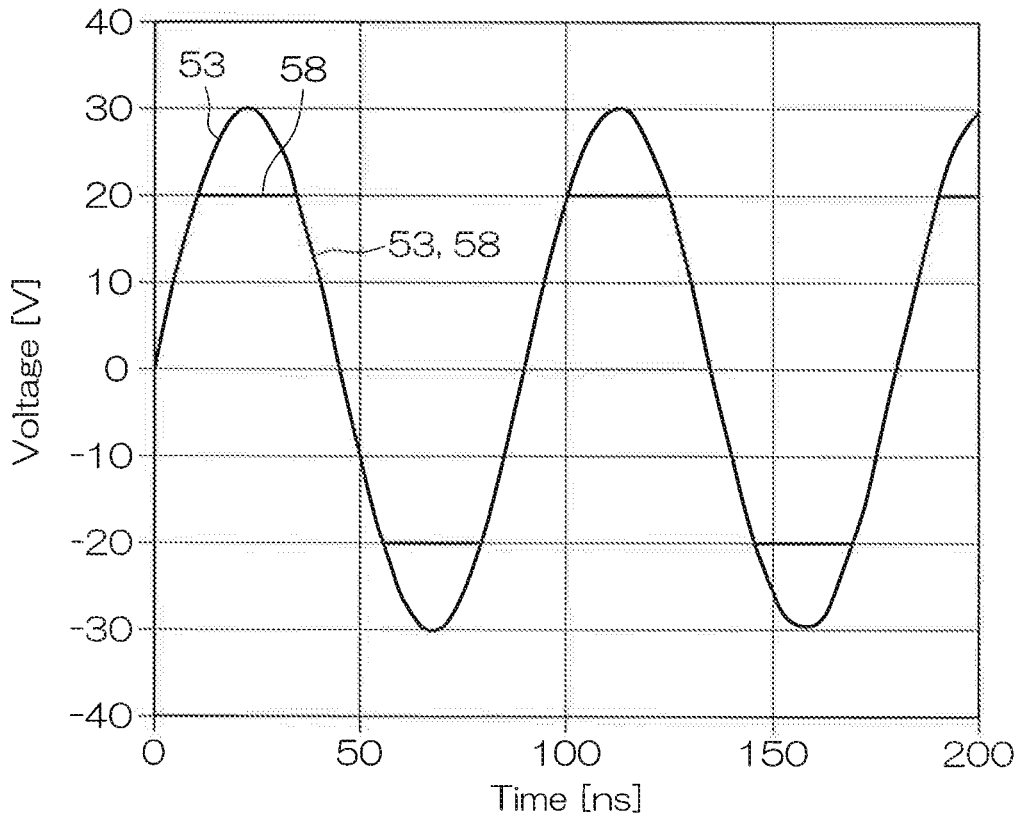

FIG. 8 is a view showing a waveform of an input voltage (an input waveform 53) in the BCI test. FIG. 9A and FIG. 9B are views each of which shows a waveform of an output voltage of the communication line (an output waveform 54 on the high side and an output waveform 56 on the low side) when the semiconductor device 51 according to the first reference example is incorporated as the bidirectional Zener diode 49 and as the bidirectional Zener diode 50. FIG. 10A and FIG. 10B are views each of which shows a waveform of an output voltage of the communication line (an output waveform 55 on the high side and an output waveform 58 on the low side) when the semiconductor device 1 is incorporated as the bidirectional Zener diode 49 and as the bidirectional Zener diode 50.

In the semiconductor device 51, the Zener diode 22 normally functions with respect to input voltage ±30 V, and, both in the output waveform 54 on the high side and in the output waveform 56 on the low side, the voltage is output while being clamped at ±20 V as shown in FIG. 9A and FIG. 9B. On the other hand, a delay 57 resulting from the reverse recovery time trr of the Zener diode 22 occurs at a polarity inversion timing of an input voltage because the Schottky junction portion 17 is not formed.

On the other hand, in the semiconductor device 1, the Zener diode 22 normally functions with respect to input voltage ±30 V, and, both in the output waveform 55 on the high side and in the output waveform. 58 on the low side, the voltage is output while being clamped at ±20 V as shown in FIG. 10A and FIG. 10B in the same way as in the semiconductor device 51. Moreover, the Schottky junction portion 17 is formed, and therefore it is possible to allow a forward current to flow through the Schottky junction portion 17. Therefore, it is possible to make the reverse recovery time trr shorter than in a case in which a forward current is allowed to flow through the Zener diode 22 as in the semiconductor device 51, and it is understood that the voltage is output with an ideal voltage waveform without the occurrence of the delay 57.

Additionally, in the semiconductor device 1, the p type semiconductor region 12 having a relatively low withstand voltage and the guard ring 21 having a relatively higher withstand voltage than the p type semiconductor region 12, each of which serves as a pn junction region, are formed mutually independently. Hence, when a reverse voltage is applied, it is possible to hold a high ESD permissible amount by the guard ring 21 while an output voltage can be clamped to become a predetermined voltage value or less by the Zener diode 22. In other words, in the epitaxial layer 6 having the Schottky junction portion 17, it is possible to realize a semiconductor device that satisfies the requirement of three characteristics of the reverse recovery time trr, the Zener voltage $V_z$, and the ESD permissible amount by providing two kinds of regions, i.e., by providing the pn junction portion (the p type semiconductor region 12) that undertakes the Zener voltage $V_z$ and the pn junction portion (the guard ring 21) that undertakes the ESD permissible amount.

Improvement effects of the ESD permissible amount brought about by the configuration of the present preferred embodiment can be described with reference to FIG. 11 and FIG. 12.

Figure 12:
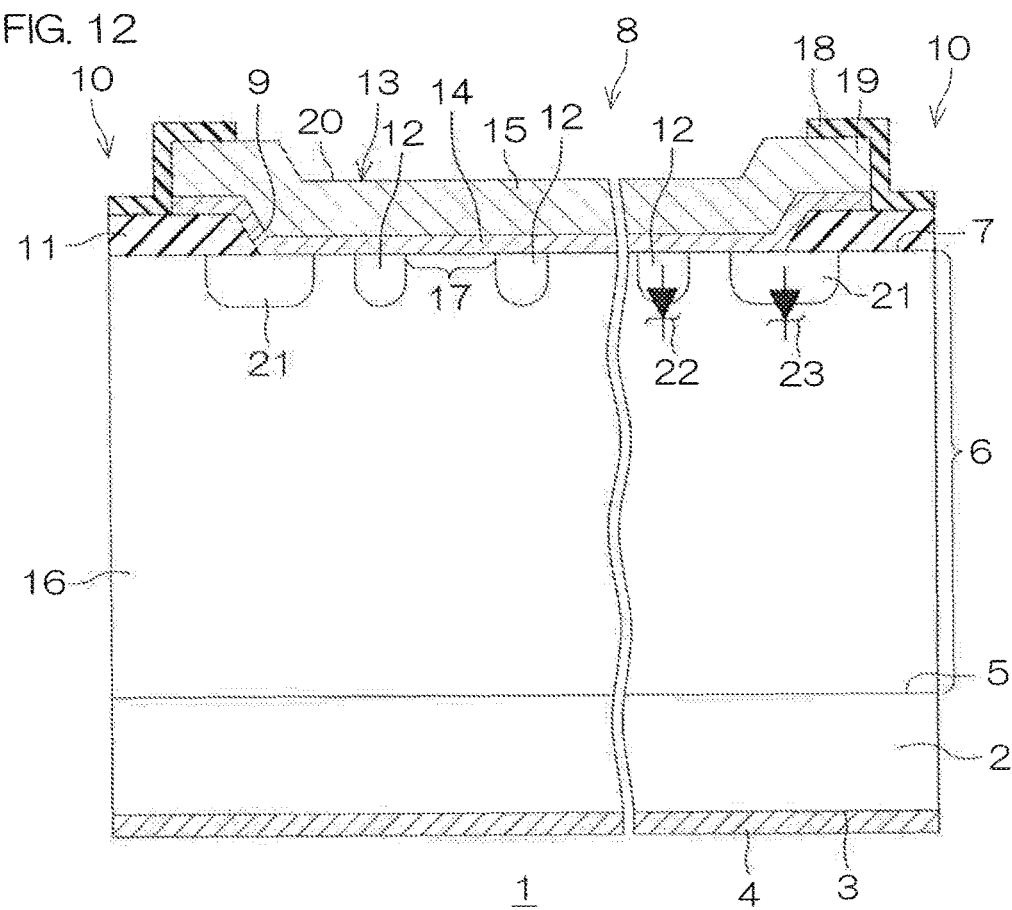
FIG. 12 is a schematic cross-sectional view of a semiconductor device according to a fourth reference example.

When improvement effects of the ESD permissible amount are described, a semiconductor device 81 according to FIG. 12 (fourth reference example) is mentioned as a configuration compared with that of the semiconductor device 1. The semiconductor device 81 of FIG. 8 differs from the semiconductor device 1 in the fact that the depth of the guard ring 21 is substantially equal to that of the p type semiconductor region 12.

Figure 11:
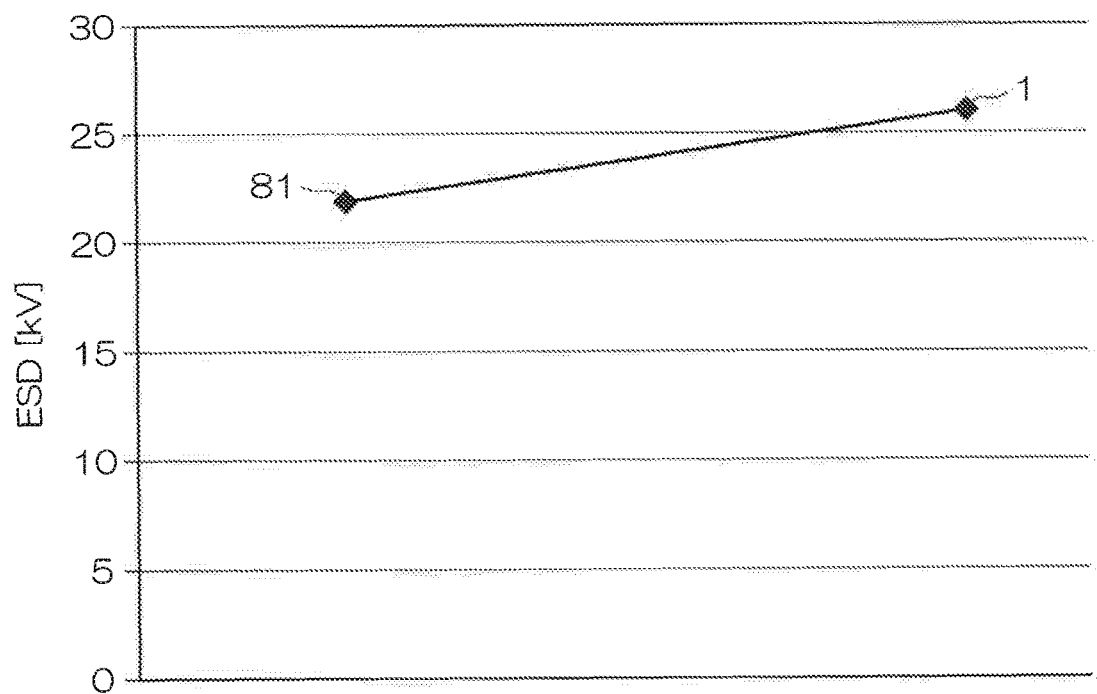
FIG. 11 is a view showing an improvement effect of an ESD permissible amount.

From the simulation result of FIG. 11, it has been understood that the ESD permissible amount can be improved as high as about 10% in comparison with the configuration of the semiconductor device 81 if the configuration of the semiconductor device 1 is employed.

In the semiconductor device 61, which is not to be simulated with respect to the BCI test and the ESD permissible amount, the Schottky junction portion 17 is formed, and therefore it is conceivable that the delay 57 can be reduced, and yet only the comparatively shallow guard ring 21 is formed as a pn junction region, and the area of the pn junction region is made smaller than in the semiconductor device 51, and therefore the ESD permissible amount is expected to be reduced. On the other hand, in the semiconductor device 71, the guard ring 21 is deeper than in the semiconductor device 61, and the ESD permissible amount is expected to be raised, and yet, in opposition thereto, the Zener voltage $V_z$ becomes higher, and, unlike the waveforms 54 and 55 of FIGS. 9A, 9B and FIGS. 10A, 10B, there is a fear that the output voltage cannot be clamped to become a predetermined voltage value or less.

Although the preferred embodiment of the present invention has been described as above, the present invention can be embodied in other modes.

Figure 13:
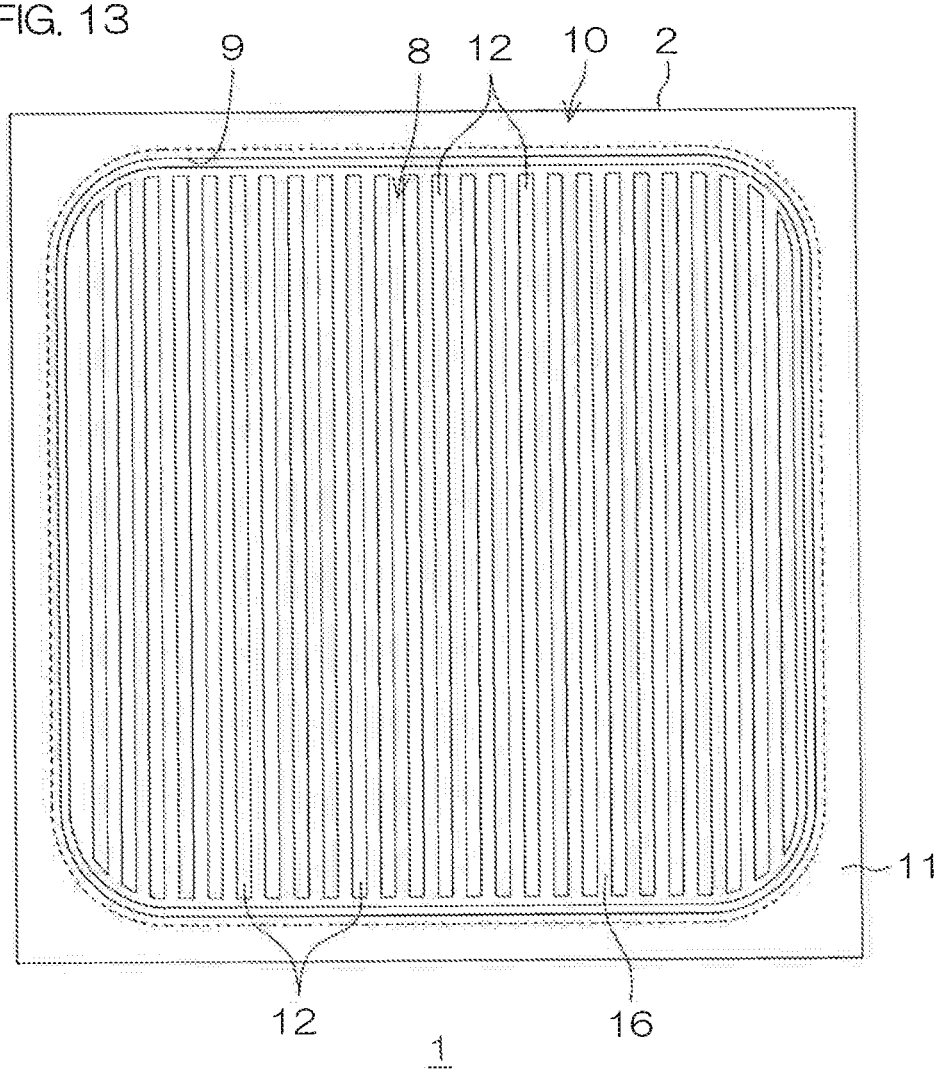
FIG. 13 is a schematic plan view of a semiconductor device according to another preferred embodiment of the present invention.

For example, the plurality of p type semiconductor regions 12 may be arranged in a stripe shape manner as shown in FIG. 13 although the plurality of p type semiconductor regions 12 are arranged in a dot shape manner in the active region 8 as described in the above preferred embodiment. In this case, the pitch P of the stripe-shaped p type semiconductor region 12 may be, for example, 3.0 μm to 13.0 μm.

Figure 14:
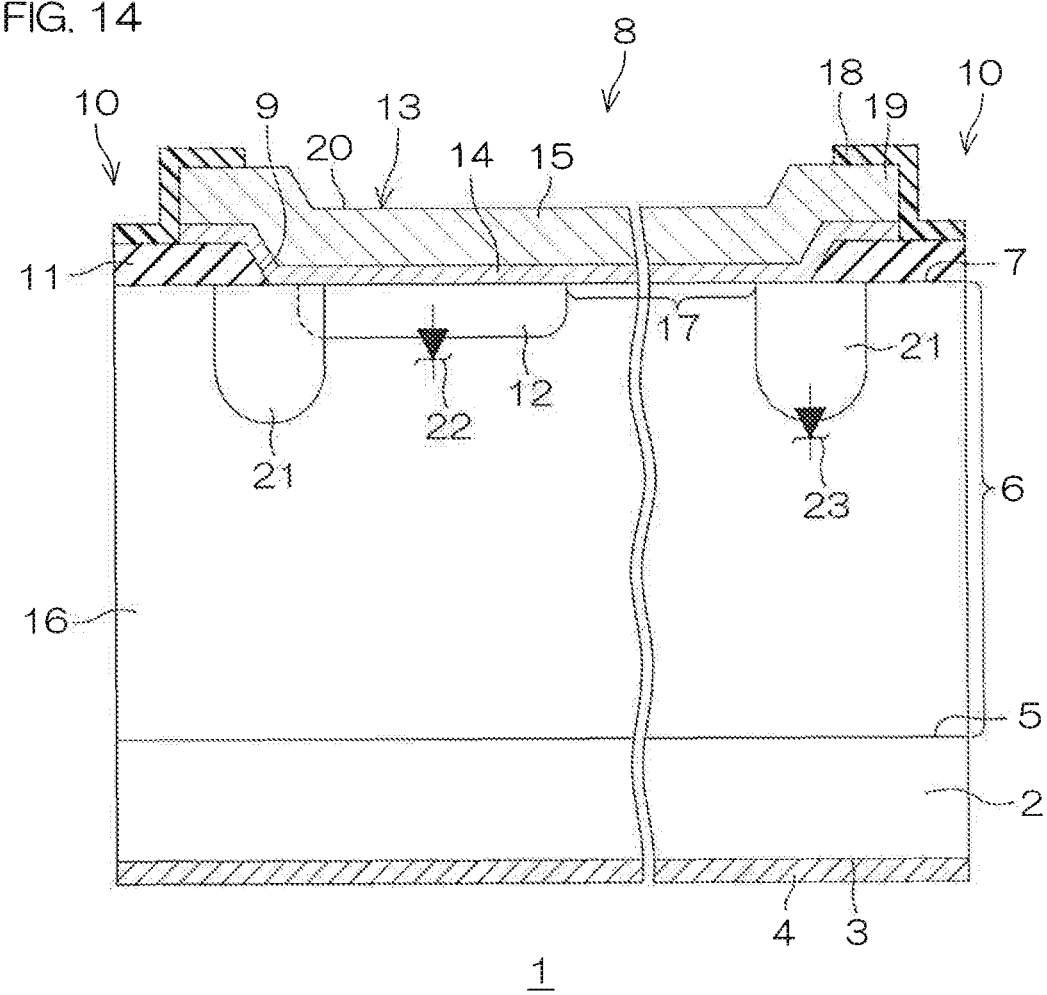
FIG. 14 is a schematic cross-sectional view of a semiconductor device according to another preferred embodiment of the present invention.

Additionally, only one p type semiconductor region 12 may be formed so as to come into contact with the guard ring 21 (so as to allow one part to overlap therewith) as shown in FIG. 14 although the plurality of p type semiconductor regions 12 are formed, and are all formed to be away from the guard ring 21 (so as not to come into contact therewith) as described in the above preferred embodiment. Of course, the single p type semiconductor region 12 may be formed away from the guard ring 21 (not shown).

Additionally, a substrate made of a semiconductor material, such as SiC (silicon carbide), other than silicon may be used instead of the silicon substrate 2 although the silicon substrate 2 is used as an example of a semiconductor substrate as described in the above preferred embodiment.

Additionally, although the diode (bidirectional Zener diode) for protection that is incorporated in the communication system 30 for one purpose of use of the semiconductor device 1 is taken as an example as described in the above preferred embodiment, the semiconductor device 1 can be used for another purpose of use.

Besides, various design changes can be made within the scope of the subject matter mentioned in the claims.

What is claimed is:

1. A semiconductor device comprising:
a first conductivity type semiconductor layer;
a second conductivity type region selectively formed in the semiconductor layer;
a second conductivity type peripheral impurity region formed around the second conductivity type region in the semiconductor layer, the peripheral impurity region being spaced apart from the second conductivity type region;
a Schottky electrode that is formed on the semiconductor layer and that forms a Schottky junction portion between a first conductivity type part of the semiconductor layer and the Schottky electrode, the Schottky electrode being in contact with the first conductivity type part of the semiconductor layer, the second conductivity type region and the peripheral impurity region;
a first diode region including a first pn junction portion between the peripheral impurity region and the first conductivity type part of the semiconductor layer; and
a second diode region including a Zener diode made of a second pn junction portion between the second conductivity type region and the first conductivity type part of the semiconductor layer, the second diode region formed at more inner side of the semiconductor device than the first diode region,
wherein the first pn junction portion has a higher withstand voltage than a Zener voltage $V_Z$ of the Zener diode, and
a first withstand voltage of the first diode region is higher than a second withstand voltage of the second diode region.

2. The semiconductor device according to claim 1, wherein, based on a front surface of the semiconductor layer, the peripheral impurity region is deeper than the second conductivity type region.

3. The semiconductor device according to claim 2, wherein a depth of the peripheral impurity region is 1.2 μm to 4.2 μm, and a depth of the second conductivity type region is 0.6 μm to 1.4 μm.

4. The semiconductor device according to claim 3, wherein a series resistance of the first conductivity type part of the semiconductor layer is 0.09 Ω·cm to 0.14 Ω·cm.

5. The semiconductor device according to claim 2, wherein a depth of the peripheral impurity region is 3.6 μm to 4.5 μm, and a depth of the second conductivity type region is 0.9 μm to 2.5 μm.

6. The semiconductor device according to claim 3, wherein a series resistance of the first conductivity type part of the semiconductor layer is 0.14 Ω·cm to 0.2 Ω·cm.

7. The semiconductor device according to claim 1, wherein, in a depth direction from a front surface of the semiconductor layer, a concentration gradient of the peripheral impurity region is more gradual than a concentration gradient of the second conductivity type region.

8. The semiconductor device according to claim 7, wherein the peripheral impurity region has an impurity concentration of $1\times10^{18}$ cm$^{-3}$ to $5\times10^{19}$ cm$^{-3}$, and the second conductivity type region has an impurity concentration of $5\times10^{18}$ cm$^{-3}$ to $1\times10^{20}$ cm$^{-3}$.

9. The semiconductor device according to claim 1, wherein the second conductivity type regions are arranged in a dot shape manner in a plan view, and
    the peripheral impurity region includes a guard ring that surrounds the second conductivity type regions.

10. The semiconductor device according to claim 1, wherein the second conductivity type regions are arranged in a stripe shape manner in a plan view, and
    the peripheral impurity region includes a guard ring that surrounds the second conductivity type regions.

11. The semiconductor device according to claim 1, wherein the semiconductor layer has a planar size of 0.2 mm square to 0.45 mm square.

12. The semiconductor device according to claim 1, further comprising a bidirectional Zener diode incorporated in a communication circuit.

13. The semiconductor device according to claim 1, wherein no current is flowed through the first diode region when a reverse voltage which is higher than the second withstand voltage and lower than the first withstand voltage is applied to the Schottky electrode.

\* \* \* \* \*